United States Patent [19]
Yoshida et al.

[11] Patent Number: 5,144,636
[45] Date of Patent: Sep. 1, 1992

[54] LASER BEAM OSCILLATING APPARATUS

[75] Inventors: Toshihiko Yoshida; Masanori Watanabe; Osamu Yamamoto, all of Nara, Japan

[73] Assignee: Sharp Kabushiki Kaisha, Japan

[21] Appl. No.: 647,022

[22] Filed: Jan. 29, 1991

[30] Foreign Application Priority Data

Jan. 31, 1990 [JP] Japan .................................. 2-22956

[51] Int. Cl.$^5$ .............................................. H01S 3/19
[52] U.S. Cl. ...................................... 372/50; 372/21; 385/130; 359/326; 359/328; 359/332
[58] Field of Search ............... 372/21, 25, 50, 102, 372/108; 385/130, 11; 359/326, 328, 332

[56] References Cited

U.S. PATENT DOCUMENTS

| | | | |
|---|---|---|---|
| 4,250,465 | 2/1981 | Leib | 372/24 |
| 4,309,667 | 1/1982 | Di Forte et al. | 372/50 |
| 4,318,058 | 3/1982 | Mito et al. | 372/50 |
| 4,649,351 | 3/1987 | Veldkamp et al. | 330/4.3 |
| 4,725,131 | 2/1988 | Goodwin et al. | 350/174 |
| 5,007,694 | 4/1991 | Yamamoto et al. | 350/96.14 |
| 5,016,253 | 5/1991 | Kubota | 372/50 |
| 5,046,802 | 9/1991 | Yamamoto et al. | 359/328 |

OTHER PUBLICATIONS

T. Tamir and S. T. Peng, "Analysis and Design of Grating Couplers": Appl. Phys. 14, pp. 235-254, 1977.

E. J. Lim et al., "Second-Harmonic Generation of Green Light in Periodically Poled Planar Lighium Niobate Waveguide", Electronics Letters vol. 25, No. 3, pp. 174-175, Feb. 2, 1989.

*Primary Examiner*—Georgia Y. Epps
*Attorney, Agent, or Firm*—Nixon & Vanderhye

[57] ABSTRACT

A laser beam oscillating apparatus which includes a plurality of semiconductor laser beam oscillators (21, 22, 23) oscillating laser beams of a different wavelength from each other, an optical waveguide (12) formed on a substrate (11) so that the oscillated laser beams propagate therein and are then emitted in the same direction from the output end thereof and an optical coupler (13) to introduce the laser beams into the optical waveguide, thus allowing simultaneous introduction of these semiconductor laser beams of different wavelengths into the optical waveguide and simultaneous output of them in the same direction from the output end thereof.

8 Claims, 2 Drawing Sheets

LASER BEAM OSCILLATING APPARATUS

BACKGROUND OF THE INVENTION

1. Field of the Invention

The present invention relates to a laser beam oscillating apparatus, which is used in an information processing apparatus such as an optical memory disc system or a laser beam printer, and an optical application measuring instrument.

2. Description of the Prior Art

Recently, because of its easy condensing and superior directivity, laser beams generated by a semiconductor laser device have been used for an information processing apparatus such as an optical memory disc system or a laser beam printer, an optical application measuring instrument and other related apparatus both for industrial and household uses. In addition, because of its small-size and oscillating ability the semiconductor laser devices find many applications in information processing apparatus. The semiconductor laser beams used for such applications are normally red or near infrared having a long wavelength of 680 nm to 1550 nm. Under the recent trend of displaying colored pictures on a laser display such as semiconductor laser devices, a new type of oscillator capable of oscillating green, blue or other color laser beams than red is being developed.

One of the methods of obtaining shortwave laser beams using a small sized device is to covert the optical wavelength. One known method using this technique utilizes the generation of sum frequency wave in which frequencies of plural optical eaves are summed, specifically second harmonics or third harmonics in which two or three of same optical frequencies are summed, respectively. For example, Applied Physics, vol. 56, 12, 1637-1641(1987) reports that second harmonics generate with 1% converting efficiency from the semiconductor laser beams having the wavelength of 840 nm and the output of 40 mW using an optical waveguide formed on a substrate made of $LiNbO_3$ by means of the proton-exchange method. The report describes that when the semiconductor laser beams are propagated within the optical waveguide having the width of 2.0 $\mu$m and the depth of 0.4 $\mu$m, a blue harmonic wave having the wavelength of 420 nm formed on the substrate are emitted into the substrate at the slant angle of approximately 16.2° according to the Cerenkov radiation. When the fundamental waves are YAG laser beams having the wavelength of 1060 nm, green laser beams are obtained though, in this case, the radiation angle is slightly different from that of the blue laser beams having the wavelength of 425 nm.

However, the three primary colors of red, green and blue are required to display a color image on a display device. For this purpose, it is possible to use three optical wavelength converters each oscillating laser beams of one of the three primary colors and to superpose the thus oscillated laser beams of three colors by means of a beam splitter, etc. This method, however, needs a large scale apparatus, negating the advantage of using the semiconductor laser device.

Gas laser apparatus such as a He-Cd laser have realized laser beam oscillating devices capable of emitting laser beams of different wavelengths, which are, however, disadvantageously very large in size and short in duration.

In addition, it is dangerous and must be careful to radiate invisible beams such as near infrared beams emitted from the semiconductor laser beam device at the high output like several tens of mW. If such invisible laser beams be emitted together with visible beams in the same direction, they can be directionally controlled simultaneously when the visible beams are controlled, thereby ensuring notable improvement of safety.

SUMMARY OF THE INVENTION

The laser beam oscillating apparatus, which overcomes the above-discussed and numerous other disadvantages and deficiencies of the prior art, comprises a plurality of semiconductor laser beam oscillators each oscillating semiconductor laser beams of a different wavelength from each other, an optical waveguide formed on a substrate so that the semiconductor laser beams oscillated by each of the semiconductor laser beam oscillators are propagated therein and then emitted in the same direction from the output thereof, and an optical coupler disposed so as to introduce the semiconductor laser beams oscillated by each of said semiconductor laser beam oscillators into said optical waveguide, wherein each of said semiconductor laser beam oscillators are disposed at a predetermined position with respect to said optical coupler so that the semiconductor laser beams simultaneously oscillated by each of the semiconductor laser beam oscillators are simultaneously introduced into the optical waveguide from the optical coupler.

In a preferred embodiment, the substrate is provided with quasi phase matching parts.

In a preferred embodiment, the substrate is made of $LiNbO_3$.

In another preferred embodiment, the substrate is made of sodium nitrate.

Thus, the invention described herein makes possible the objectives of (1) providing a laser beam oscillating apparatus of small size capable of oscillating laser beams of different wavelengths, and (2) providing a laser beam oscillating apparatus capable of easily controlling the direction of invisible laser beams.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT

EXAMPLE 1

Figure 1:
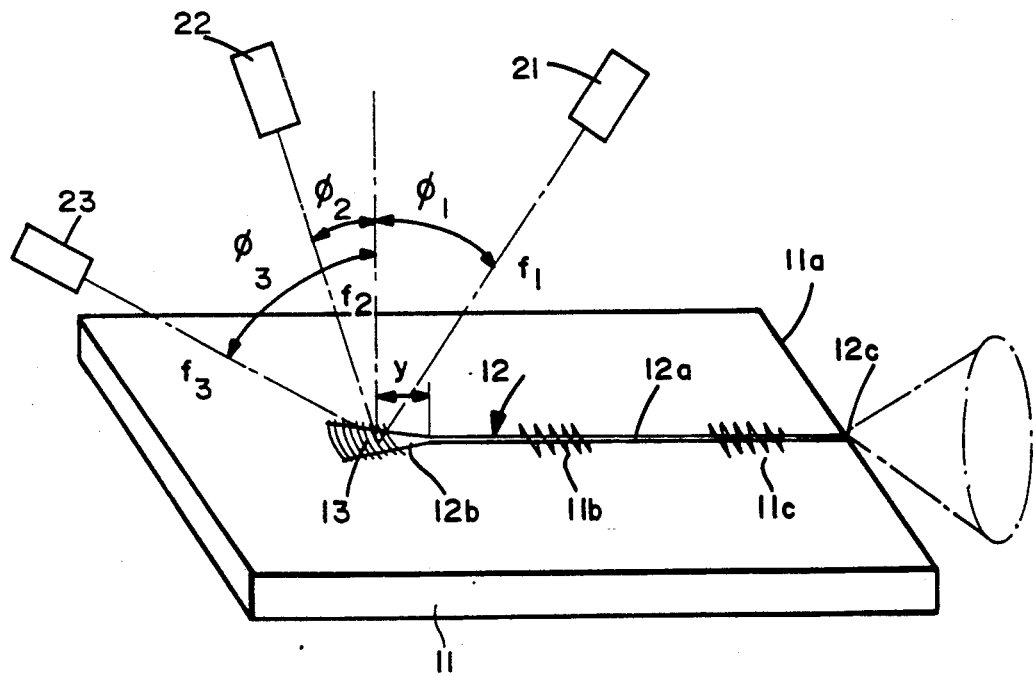
FIGS. 1 to 3 are diagrammatic views illustrating the structures of respective embodiments according to the present invention.

FIG. 1 shows a laser beam oscillating apparatus comprising a rectangular-shaped crystalline substrate 11 having a non-linear optical effect on which a linear waveguide 12 is formed and three semiconductor laser beam oscillators 21, 22, 23 each emanating semiconductor laser beams of a different wavelength from others onto the substrate 11.

A material used for the crystalline substrate 11, for example, a Z cut $LiNbO_3$ +c plate has a great non-linear optical coefficient.

The optical waveguide 12 comprises a linear propagating part 12a formed parallel to the longitudinal side of the substrate 11 and an incident part 12b formed at one end of the propagating part 12a and connected thereto in the triangular shape when seen from the top. The other end of the propagating part 12a reaches a side face 11a of the substrate 11 where its output part 12c is formed.

On the part of the substrate 11 corresponding to the incident part 12b of the optical waveguide 12 is provided with a diffraction grating optical coupler 13, into which semiconductor laser beams of different wavelengths oscillated by the semiconductor laser beam oscillators 21, 22, 23 are emanated.

The diffraction grating optical coupler 13 includes a plurality of protruded bars formed on the substrate 11 in a predetermined curved shape suitable for the introduction of the laser beams oscillated by the semiconductor laser beam oscillators 21, 22, 23 into the optical waveguide 12. Each of the semiconductor laser beam oscillators 21, 22, 23 is disposed at a place so that the oscillated laser beams be emanated into the diffraction grating optical coupler 13 at a predetermined incident angle, allowing the oscillated laser beams to be introduced through the optical coupler 13 to the optical waveguide 12.

On the part of the substrate 11 corresponding to the linear propagating part 12a are provided a pair of quasi phase matching parts 11b, 11c in which a non-linear optical coefficient on the substrate 11 is periodically reversed to the direction of the propagating part 12a. As reported by E. J. Lim et al. in Electronics Letters, vol. 25, 3, 174(1989), this pair of quasi phase matching parts 11b, 11c approximately match the phases of fundamental waves and second harmonics. For example, the strips-patterned Ti formed vertical to the propagating part 12a of the optical waveguide 12 is periodically deposited in the direction in which the propagating part 12a extends and is diffused at 1100° C. thereby periodically reversing the direction of polarization in the crystal and as a result reversing the non-linear optical coefficient. Consequently, the fundamental waves propagating in the propagating part 12a of the optical waveguide 12 are approximately phase-matched to generate second harmonics. Each of the quasi phase matching parts 11b, 11c is used for quasi phase matching of either of the laser beams oscillated by the semiconductor laser oscillators 21, 22, 23.

In this example, as the semiconductor laser beams 21, 22, 23 are used in InGaAlP/GaAs group semiconductor laser beam oscillator having the oscillating wavelength of 680 nm, a GaAlAs/GaAs group semiconductor laser beam oscillator having the oscillating wavelength of 850 nm and an InGaAsP/InP group semiconductor laser beam oscillator having the oscillating wavelength of 1.1 μm, respectively. The shape of the diffraction grating optical coupler 13 and the position of each of the semiconductor laser oscillators 21, 22, 23 relative to the diffraction grating optical coupler 13 are determined as follows.

The incident angle $\phi$ at which the fundamental wave of the wavelength $\lambda$ is introduced into the optical waveguide of the equivalent refractive index n is substantially determined by the following equation, wherein $\Lambda$ is a grating period at the area surrounding the radiation position (origin) of the diffraction grating optical coupler:

$$\sin\phi = n - \Lambda/\lambda \quad (1)$$

In the case of this example, the wavelengths of the semiconductor laser beams oscillated by the semiconductor laser beam oscillators 21, 22, 23 are 680 nm, 850 nm and 1.1 μm, while the equivalent refractive index of the optical waveguide against the above semiconductor laser beams are 2.172, 2.215, and 2.240, respectively. Accordingly, the obtained incident angles $\phi_1$, $\phi_2$ and $\phi_3$ of the above semiconductor laser beams against the diffraction grating optical coupler 13 are $-15.8°$, $19.0°$ and $46.8°$ respectively.

As reported by Ura et al., in a paper by Institute of Electronics and Communication Engineers of Japan, J68-C, the pattern of the protruding bars of the diffraction grating optical coupler 13 is a group of curved lines satisfying the following equation given a predetermined wavelength when r is a distance between the radiation position of the diffraction grating optical coupler 13 and the linear propagating part 12a of the optical waveguide 12.

$$\sqrt{(y - f\cdot\sin\phi)^2 + f\cdot\cos^2\phi} + n\cdot\sqrt{(x^2 + (y - r)^2)} = m\cdot\lambda + n\cdot r + f \quad (2)$$

wherein m is an integer and f is a distance between the semiconductor laser oscillator and the optical coupler.

y indicates the direction to which the optical waveguide 12 is extended and x is the direction vertical to the y direction on the substrate 11. The afore-mentioned grating coefficient $\Lambda$ is a difference of the values of x coordinate at a predetermined value of y coordinate between a pair of curves of which m's are different by 1, particularly in the case where m's are near zero. The distance f in the above equation (2) is determined as $f_1$, $f_2$ and $f_3$ so that r is constant for the semiconductor laser beams of different wavelengths oscillated by the semiconductor laser oscillators 21, 22, 23, respectively. The semiconductor laser beam oscillators 21, 22, 23 are then disposed at the positions of the distances $f_1$, $f_2$ and $f_3$, respectively, so that laser beams thereof emanate at the respective predetermined incident angles $\phi$ into a predetermined radiation position (origin) of the diffraction grating optical coupler 13 separated by a predetermined distance r from the propagating part 12a of the optical waveguide 12.

The laser beam oscillating apparatus of the above arrangement is manufactured in the following manner. First, the quasi phase matching parts 11b, 11c are formed on the +c plate LiNbO$_3$ substrate 11. In this example, the two quasi phase matching parts made periodically different are formed so as to obtain separate quasi phase matching of the laser beams having the wavelengths of 850 nm and 1.1 m emanated from the semiconductor laser oscillators 22, 23 to be introduced into the optical waveguide 12.

Then, after a metal film such as Mo is deposited on the substrate 11 by means of the electronics beam deposition or the like, the pattern of the linear optical waveguide 12 is formed in correspondence with the Ti diffused part using a photoresist by means of photolithography. Using the photoresist as a mask, the metal film of Mo, etc. is then etched with a mixed solution of phosphoric acid and nitric acid. Further, using this metal film as a mask, a proton-exchange is performed with a pyrophosphoric acid at the exchange temperature of 200° C. to form the optical waveguide 12 having the depth of 0.55 μm.

Finally, for example, aluminum is deposited by means of the electron beam deposition or the like on the substrate 11 on which the optical waveguide 12 has been formed and on the deposited face an electron beam resist is applied to draw the curved pattern of the diffraction grating optical coupler using an electron beam exposure device. Then, the electron beam resist is developed and, for example, a ZnSe film is deposited by means of the electron beam deposition. The diffraction grating optical coupler 13 is formed by removing an unnecessary part of the ZnSe film by the liftoff method. In this way, the laser beam oscillating apparatus illustrated in FIG. 1 is manufactured.

In the laser beam oscillating apparatus thus manufactured, when laser beams of the wavelengths of 680 nm, 850 nm and 1.1 μm were emanated from the simultaneously operated semiconductor laser beam oscillators 21, 22, 23, respectively, into the diffraction grating optical coupler 12, the emanated laser beams of each wavelength were introduced to the optical waveguide 12 from its incident part 12a and propagated therein.

The optical waveguide 12 being 0.55 μm deep, only laser beams of a single mode of each wavelength are propagated. The laser beams of 1.1 μm wavelength were changed to the second harmonics of 550 nm wavelength at the first quasi phase matching part 11b, while the laser beams of 850 nm wavelength to the second harmonics of 425 nm wavelength at the second quasi phase matching part 11c. The laser beams of 680 nm wavelength, however, propagated in the waveguide 12 without being changed to second harmonics at either quasi phase matching part 11b or 11c. Part of the laser beams having the wavelength of 1.1 μm were lost due to the change to the second harmonics caused by Cerenkov radiation. Consequently, white laser beams generated by the mixture of the laser beams of these three wavelengths were emitted from the output part 12c of the optical waveguide 12 located on the side face 11a of the substrate 11.

The resultant output laser beams, which formed an oval shaped far-field pattern spreading at a larger angle in the direction vertical to the substrate 11 than that in the direction horizontal thereto but having a symmetrical pattern to the axis, proved superior quality in focusing.

In this example, the quasi phase matching method was employed, not the phase matching method using the Cerenkov radiation, to change the laser beams of a predetermined wavelength into second harmonics. The quasi phase matching method has an advantage of emitting laser beams of different wavelengths in the same direction, free from the problem inherent to the Cerenkov radiation in which second harmonics of different wavelengths are emitted from the output side 12c of the optical waveguide 12 at respective different angles. This integrated emission of laser beams of different wavelengths in the same direction enables easy application to a color display device or the like.

Though, in this example, LiNbO$_3$ was used as the substrate, any other material having a non-linear optical effect capable of forming an optical waveguide and of performing quasi phase matching can also be used as the substrate.

EXAMPLE 2

Figure 2:
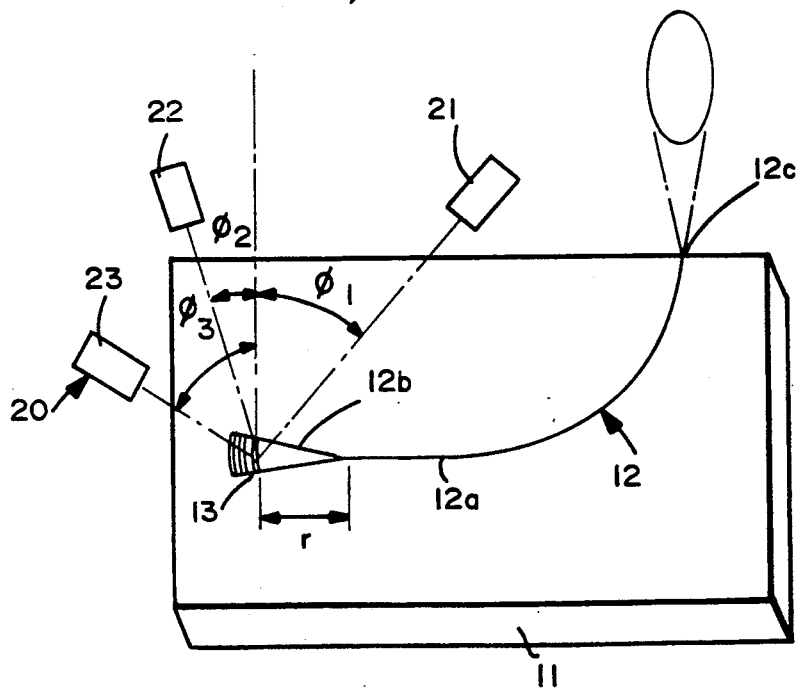

FIG. 2 shows another example of the laser beam oscillating apparatus according to the present invention. In this example, a X-cut LiNbO$_3$ is used as a substrate 11. A waveguide 12 on the substrate 11 has a propagating part 12a in a curved shape and an output part 12c located on a longitudinal side face of the substrate 11. As semiconductor laser beam oscillators 21, 22, 23 are used an InGaAsP/InP group semiconductor laser beam oscillator having the oscillating wavelength of 1.3 μm, an InGaAsP/InP group semiconductor laser beam oscillator having the oscillating wavelength of 1.1 μm and a GaAlAs/GaAs group semiconductor laser beam oscillator having the oscillating wavelength of 0.85 μm, respectively. The other structure of the apparatus is the same as that of Example 1 except that the quasi phase matching parts 11b, 11c are not provided on the substrate 11 of this example.

In the laser beam oscillating apparatus thus arranged, due to birefringence of the substrate 11, the refractive index against the TM mode of fundamental waves propagating in the optical waveguide 12 and that against the TE mode of second harmonics coincide with each other at the respective predetermined angles against the Z axis. As a result, the fundamental waves propagating in the optical waveguide 12 are changed to second harmonics by means of the angle phase matching, thereby enabling white laser beams formed by the mixture of red, green and blue beams having wavelengths of 650 nm, 550 nm and 425 nm, respectively, to be emitted from the output part 12c of the optical waveguide 12.

EXAMPLE 3

Figure 3:
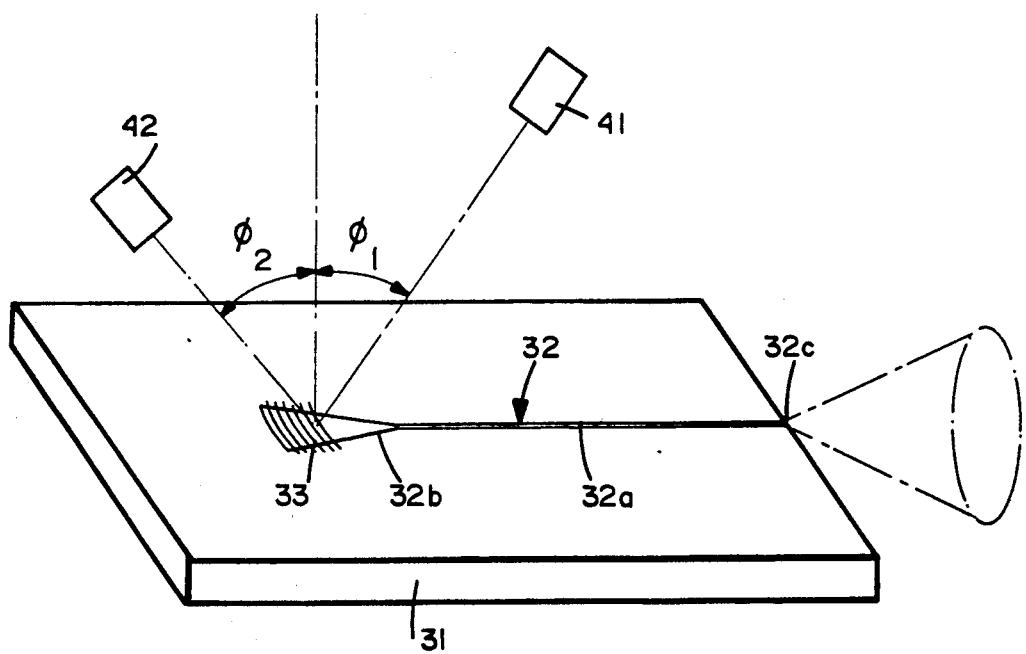

FIG. 3 shows still another example of the laser beam oscillating apparatus according to the present invention. In this example, soda glass (sodium nitrate) is used as a substrate 31. Similarly to Example 1, on the substrate 31 is formed an optical waveguide 32 comprising an incident part 32b and a linear propagating part 32a. A diffraction grating optical coupler 33 is disposed at the position on the substrate 31 corresponding to the incident part 32b of the optical waveguide 32. Laser beams oscillated by a pair of semiconductor laser beam oscillators 41, 42 are emanated into the diffraction grating optical coupler 33. As semiconductor laser beam oscillators 41, 42 are used an InGaAsP/InP group semiconductor laser beam oscillator oscillating infrared beams having the wavelength of 1.3 μm and an InGaAlP/GaAs group semiconductor laser beam oscillator oscillating visible beams having the wavelength of 680 nm, respectively. These semiconductor laser beam oscillators 41, 42, similar to Example 1, are disposed at the positions separated by the respective predetermined distances so that the oscillated laser beams can be emanated into the diffraction grating optical coupler 33 at the respective predetermined incident angles.

The laser beam oscillating apparatus of this example is manufactured as follows. Ta, for example, is deposited on the substrate 31 made of soda glass by means of the normal electron beam deposition or the like. Then a pattern of the optical waveguide is formed using a photoresist by means of the normal photolithography, and the Ta film on the substrate 11 is etched by means of the CF$_4$ using reactive ion beam etching (RIE). After the etching, a proton-exchange is performed with potassium nitrate using this Ta film as a mask, thus to form the optical waveguide 32. The diffraction grating optical coupler 33 is formed by means of the electron beam exposure method in the same manner as in Example 1 except that alumina was used in place of ZnSe in this example.

In the laser beam oscillating apparatus of this example, similarly, laser beams emanated into the diffraction grating optical coupler 33 are introduced into the optical waveguide 32 and, while propagating therein, are coupled without change of the wavelengths. Then, laser beams of different wavelengths are emitted as integrated laser beams from the output part 32c of the optical waveguide 32. As a result, invisible infrared beams having the wavelength of 1.3 μm are emitted together with visible beams having the wavelength of 680 nm, enabling direction control of invisible beams by controlling the direction of visible beams.

Thus, this invention provides the laser beam oscillating apparatus capable of simultaneously emitting semiconductor laser beams of different wavelengths in the same direction from the output part of the optical waveguide formed on the substrate, as a result achieving compactness and long duration of the apparatus and therefore allowing wider and easier application to, for example, a color display device. Furthermore, this invention provides the laser beam oscillating apparatus capable of controlling the direction of invisible laser beams by using invisible laser beams and visible beams as the emanated semiconductor laser beams at the same time and by controlling the direction of visible beams, thereby allowing easy and safe handling of invisible beams such as infrared beams.

According to the present invention, a plurality of semiconductor laser beams of different wavelengths are entered into the optical coupler at the respective predetermined incident angles with respect to the optical coupler, allowing simultaneous introduction of these semiconductor laser beams into the optical waveguide from the optical coupler and, after propagating through the optical waveguide, simultaneous output of them in the same direction from the output end of the optical waveguide.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A laser beam oscillating apparatus comprising:
    a plurality of semiconductor laser beam oscillators each oscillating semiconductor laser beams of a different wavelength,
    optical waveguide means formed on a substrate for propagating the semiconductor laser beams oscillated by each of the semiconductor laser beam oscillators and then emitting the semiconductor laser beams in a same direction from an output end thereof,
    optical coupler means disposed for introducing the semiconductor laser beams oscillated by each of said semiconductor laser beam oscillators into said optical waveguide means, wherein each of said semiconductor laser beam oscillators is disposed at a predetermined position with respect to said optical coupler means so that the semiconductor laser beams simultaneously oscillated by each of the semiconductor laser beam oscillators are simultaneously introduced into the optical waveguide from the optical coupler, and
    wherein the substrate has a non-linear optical effect.

2. A laser beam oscillating apparatus according to claim 1, wherein the substrate is provided with quasi-phase matching parts.

3. A laser beam oscillating apparatus according to claim 1, wherein the substrate is made of LiNbO$_3$.

4. A laser beam oscillating apparatus according to claim 1, wherein the substrate is made of sodium nitrate.

5. A laser beam oscillating apparatus comprising a substrate having a non-linear optical effect, an optical coupler for introducing a semiconductor laser beam irradiated from outside, an optical waveguide for propagating the laser beam from the optical coupler, the optical coupler and the optical waveguide being formed on the substrate, the substrate emitting a laser beam from an output side thereof, a plurality of semiconductor lasers disposed outside the substrate such that all the laser beams are directed toward the optical oscillators, wherein the angle of each laser beam is determined such that all those laser beams are simultaneously introduced into the optical waveguide through the optical coupler.

6. A laser beam oscillating apparatus according to claim 5, wherein the substrate is provided with quasi-phase matching parts where at least one of the laser beams is converted into a second harmonic beam of itself.

7. A laser beam oscillating apparatus according to claim 5, wherein the substrate is made of LiNbO$_3$.

8. A laser beam oscillating apparatus according to claim 5, wherein the substrate is made of sodium nitrate.

* * * * *

UNITED STATES PATENT AND TRADEMARK OFFICE
CERTIFICATE OF CORRECTION

PATENT NO. : 5,144,636
DATED : September 1, 1992
INVENTOR(S) : Toshihiko Yoshida, Masanori Watanabe, Osamu Yamamoto It is certified that error appears in the above-identified patent and that said Letters Patent is hereby corrected as shown below:

Column 1, line 52, "425 nm" should be --420 nm--.

Column 4, line 28, "coefficient" should be --period--.

Figure 1, "y" should be --r--.

Signed and Sealed this

Twelfth Day of October, 1993

Attest:

BRUCE LEHMAN

*Attesting Officer*      *Commissioner of Patents and Trademarks*